(12) United States Patent
Hayashi

(10) Patent No.: US 10,115,882 B2
(45) Date of Patent: Oct. 30, 2018

(54) THERMOELECTRIC CONVERSION ELEMENT AND THERMOELECTRIC CONVERSION MODULE

(71) Applicant: FUJIFILM Corporation, Tokyo (JP)

(72) Inventor: Naoyuki Hayashi, Ashigara-kami-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 15/679,276

(22) Filed: Aug. 17, 2017

(65) Prior Publication Data

US 2018/0026172 A1 Jan. 25, 2018

Related U.S. Application Data

(63) Continuation of application No. PCT/JP2016/052201, filed on Jan. 26, 2016.

(30) Foreign Application Priority Data

Feb. 24, 2015 (JP) .................................. 2015-033987
Sep. 15, 2015 (JP) .................................. 2015-181758

(51) Int. Cl.
*H01L 35/02* (2006.01)
*H01L 35/30* (2006.01)
*H01L 35/32* (2006.01)

(52) U.S. Cl.
CPC .................................. *H01L 35/32* (2013.01)

(58) Field of Classification Search
CPC ......... H01L 35/02; H01L 35/04; H01L 35/06; H01L 35/10; H01L 35/12; H01L 35/28; H01L 35/32

See application file for complete search history.

(56) References Cited

U.S. PATENT DOCUMENTS

2011/0214707 A1 9/2011 Suzuki et al.
2012/0111387 A1 5/2012 Cho
(Continued)

FOREIGN PATENT DOCUMENTS

JP 2002335021 A 11/2002
JP 3981738 B2 9/2007
(Continued)

OTHER PUBLICATIONS

International Preliminary Report on Patentability issued from the International Bureau in counterpart International Application No. PCT/JP2016/052201, dated Aug. 29, 2017.
(Continued)

*Primary Examiner* — Susan D Leong
(74) *Attorney, Agent, or Firm* — Sughrue Mion, PLLC

(57) ABSTRACT

Provided are a thermoelectric conversion element and a thermoelectric conversion module using the thermoelectric conversion element. The thermoelectric conversion element has a first substrate having a high thermal conduction portion which has a thermal conductivity higher than a thermal conductivity of other regions, a thermoelectric conversion layer formed on the first substrate, a pressure sensitive adhesive layer formed on the thermoelectric conversion layer, a second substrate formed on the pressure sensitive adhesive layer, having a concave portion, which at least partially overlaps the high thermal conduction portion of the first substrate in a plane direction and is on the pressure sensitive adhesive layer side, and made of a metal material, and an electrode pair connected to the thermoelectric conversion layer. According to the present invention, a thermoelectric conversion element and a thermoelectric conversion module are obtained which improve the heat utilization efficiency and generate electric power with excellent efficiency.

11 Claims, 5 Drawing Sheets

(56) References Cited

U.S. PATENT DOCUMENTS

| | | | |
|---|---|---|---|
| 2012/0227780 A1* | 9/2012 | Kurihara | H01L 27/16 136/224 |
| 2014/0034106 A1 | 2/2014 | Suzuki et al. | |
| 2016/0222256 A1* | 8/2016 | Kato | H01L 35/32 |
| 2016/0260883 A1* | 9/2016 | Yonekura | H01L 35/24 |

FOREIGN PATENT DOCUMENTS

| | | | | |
|---|---|---|---|---|
| JP | 2009016442 A | 1/2009 | | |
| JP | 2012080059 A | 4/2012 | | |
| WO | 2013121486 A1 | 8/2013 | | |
| WO | WO-2015046253 A1 * | 4/2015 | | H01L 35/32 |

OTHER PUBLICATIONS

Translation of Written Opinion dated Apr. 19, 2016, issued by the International Bureau in counterpart Application No. PCT/JP2016/052201.

International Search Report dated Apr. 19, 2016, issued by the International Bureau in counterpart Application No. PCT/JP2016/052201.

\* cited by examiner

THERMOELECTRIC CONVERSION ELEMENT AND THERMOELECTRIC CONVERSION MODULE

CROSS-REFERENCE TO RELATED APPLICATIONS

This application is a Continuation of PCT International Application No. PCT/JP2016/052201 filed on Jan. 26, 2016, which claims priority under 35 U.S.C. § 119(a) to Japanese Patent Application No. 2015-033987 filed on Feb. 24, 2015 and Japanese Patent Application No. 2015-181758 filed on Sep. 15, 2015, Each of the above applications is hereby expressly incorporated by reference, in its entirety, into the present application.

BACKGROUND OF THE INVENTION

1. Field of the Invention

The present invention relates to a thermoelectric conversion element which has an excellent thermoelectric conversion performance, and a thermoelectric conversion module using the thermoelectric conversion element.

2. Description of the Related Art

Thermoelectric conversion materials that enable the interconversion of heat energy and electric energy are used in a thermoelectric conversion element such as a power generating element generating power from heat or a Peltier element.

The thermoelectric conversion element can directly convert heat energy into electric power and has an advantage of not requiring a moving part. Therefore, by providing a thermoelectric conversion module (power generating device), which is obtained by connecting a plurality of thermoelectric conversion elements, in a heat exhaust site such as an incinerator or various factory facilities, it is possible to obtain electric power in a simple manner without needing to incur operational costs.

Regarding the aforementioned thermoelectric conversion element, a so-called π-type thermoelectric conversion element is known.

The π-type thermoelectric conversion element has a constitution in which a pair of electrodes separating from each other are provided, an n-type thermoelectric conversion material and a p-type thermoelectric conversion material that also separate from each other are provided on one of the electrodes and the other respectively; and the upper surfaces of the two thermoelectric conversion materials are connected to each other through the electrodes.

By arranging a plurality of thermoelectric conversion elements such that the n-type thermoelectric conversion material and the p-type thermoelectric conversion material are alternately disposed and connecting lower electrodes of the thermoelectric conversion materials in series, a thermoelectric conversion module is formed.

A general thermoelectric conversion element including the π-type thermoelectric conversion element is constituted with an electrode on a sheet-like substrate, a thermoelectric conversion layer (power generating layer) on the electrode, and a sheet-like electrode on the thermoelectric conversion layer.

That is, in a general thermoelectric conversion element, the thermoelectric conversion layer is interposed between the electrodes in a thickness direction, and a temperature difference is caused in the thickness direction of the thermoelectric conversion layer, thereby converting heat energy into electric energy.

In contrast, JP3981738B describes a thermoelectric conversion element using a substrate having a high thermal conduction portion and a low thermal conduction portion, in which heat energy is converted into electric energy by causing a temperature difference in a plane direction of a thermoelectric conversion layer, not in the thickness direction of the thermoelectric conversion layer.

Specifically, JP3981738B describes a thermoelectric conversion element having a constitution in which a flexible film substrate constituted with two kinds of material having different thermal conductivities are disposed on both surfaces of a thermoelectric conversion layer formed of a P-type material and an N-type material, and the materials having different thermal conductivities are positioned on the outer surface of the substrates in a direction opposite to a direction along which electricity is conducted.

SUMMARY OF THE INVENTION

In the thermoelectric conversion element having the constitution described in JP3981738B, a temperature difference is caused in the plane direction of the thermoelectric conversion layer due to the high thermal conduction portion provided in the substrate, thereby converting heat energy into electric energy. Accordingly, even if the thermoelectric conversion layer is thin, by increasing the distance in which the temperature difference is caused, power can be generated with excellent efficiency. Furthermore, because the thermoelectric conversion layer can be made into a sheet-like layer, the flexibility thereof is excellent as well, and a thermoelectric conversion element or a thermoelectric conversion module which can be easily installed on a curved surface or the like is obtained.

However, in recent years, the requirements that thermoelectric conversion elements need to satisfy have increasingly become strict, and the thermoelectric conversion element described in JP3981738B having a constitution, in which a temperature difference is caused in the plane direction of the thermoelectric conversion layer by using a substrate having a high thermal conduction portion and a low thermal conduction portion, has been required to further improve the thermoelectric conversion performance thereof.

The present invention has been made to solve the aforementioned problems of the related art, and an object thereof is to provide a thermoelectric conversion element, which element converts heat energy into electric energy by causing a temperature difference in a plane direction of a thermoelectric conversion layer by using a high thermal conduction portion and a low thermal conduction portion provided on a substrate, and a thermoelectric conversion module. The thermoelectric conversion element improves the heat utilization efficiency by eliminating a loss of heat transferred and yields a higher power generation capacity.

In order to achieve the aforementioned object, the present invention provides a thermoelectric conversion element comprising a first substrate having a high thermal conduction portion winch has a thermal conductivity higher than a thermal conductivity of other regions in at least a portion in a plane direction, a thermoelectric conversion layer formed on the first substrate, a pressure sensitive adhesive layer formed on the thermoelectric conversion layer, a second substrate formed on the pressure sensitive adhesive layer, having a concave portion, which at least partially overlaps the high thermal conduction portion in the plane direction and is on the pressure sensitive adhesive layer side, and made of a metal material, and an electrode pair connected to the thermoelectric conversion layer such that the thermoelectric conversion layer is interposed between the electrodes in the plane direction.

In the thermoelectric conversion element of the present invention, a depth of the concave portion is preferably equal to or greater than 20% of a thickness of the second substrate.

The thickness of the second substrate is preferably equal to or greater than 0.05 mm.

The concave portion preferably has a wall all around the peripheral region thereof in the plane direction.

The thermoelectric conversion element of the present invention preferably has an insulating layer on a front side of a surface on which the concave portion of the second substrate is formed.

The present invention also provides a thermoelectric conversion module comprising a plurality of the thermoelectric conversion elements of the present invention that is connected to each other in series.

In the thermoelectric conversion module of the present invention, a heat dissipating fin or a heat dissipating sheet is preferably provided on the second substrate side.

The heat dissipating fin or the heat dissipating sheet is preferably bonded to the second substrate by a thermally conductive adhesive sheet or a thermally conductive adhesive.

The thermoelectric conversion elements are preferably one-dimensionally or two-dimensionally arranged, all of the thermoelectric conversion elements preferably share one sheet of first substrate and one sheet of second substrate, each of the high thermal conduction portions is preferably long in the arrangement direction of the thermoelectric conversion layers, and each of the concave portions are preferably long in the same direction as a longitudinal direction of the high thermal conduction portions.

The thermoelectric conversion elements are preferably two-dimensionally arranged, the high thermal conduction portions are preferably arranged such that the longitudinal direction of the high thermal conduction portions coincides with one arrangement direction of the thermoelectric conversion elements and that the high thermal conduction portions are arranged in the other arrangement direction, and the concave portions are preferably arranged in the same direction as the high thermal conduction portions in a state where a longitudinal direction of the concave portions coincides with, the longitudinal direction of the high thermal conduction portions such that the concave portions alternate with the high thermal conduction portions.

The thermoelectric conversion layers are preferably formed at an equal interval in the arrangement direction of the high thermal conduction portions, the width and the interval of the high thermal conduction portions are preferably the same, the width and the interval of the concave portions are preferably the same, and the width of each of the high thermal conduction portions is preferably the same as the width of each of the concave portions.

According to the present invention, by reducing a loss of heat transferred and improving the heat utilization efficiency in the thermoelectric conversion element in which heat energy is converted into electric energy by causing a temperature difference in the plane direction of the thermoelectric conversion layer by using the high thermal conduction portion and the low thermal conduction portion provided on the substrate, it is possible to obtain a thermoelectric conversion element and a thermoelectric conversion module having a high power generation capacity.

DESCRIPTION OF THE PREFERRED EMBODIMENTS

Hereinafter, a thermoelectric conversion element and a thermoelectric conversion module of the present invention will be specifically described based on suitable examples shown in the attached drawings.

Figure 1A:
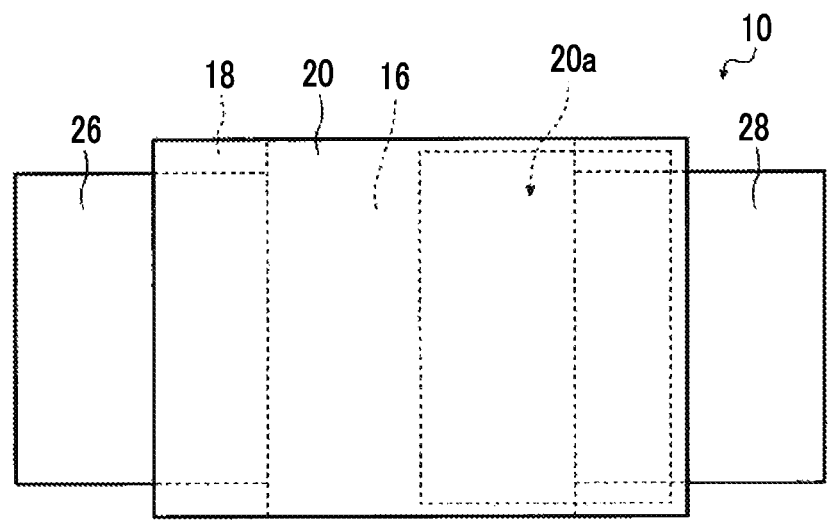
FIGS. 1A to 1C are views conceptually showing an example of a thermoelectric conversion element of the present invention.
Figure 1B:
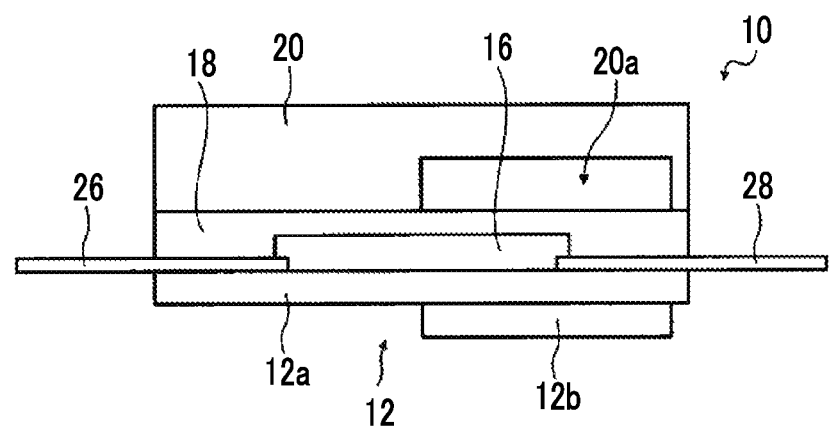
Figure 1C:
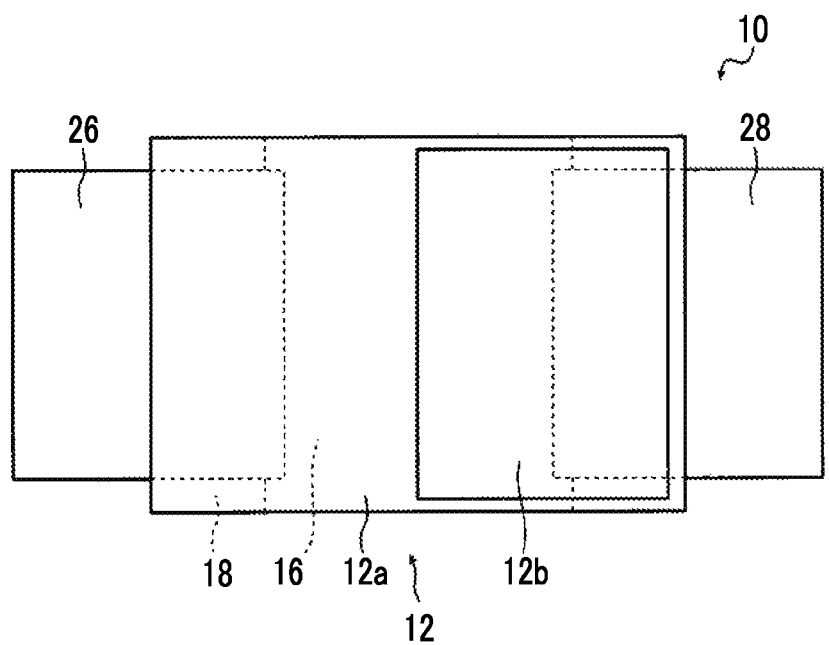

FIGS. 1A to 1C conceptually show an example of the thermoelectric conversion element of the present invention. FIG. 1 is a top view. FIG. 1B is a front view, and FIG. 1C is a bottom view. Specifically, the top view is a view obtained when FIG. 1B is seen from above the paper. The front view is a view obtained when the thermoelectric conversion element is seen in a plane direction of a substrate or the like which will be described later. The bottom view is a view obtained when FIG. 1B is seen from below the paper.

FIG. 1B shows a cross-section obtained when FIG. 1A is cut along the horizontal direction in the drawing. For simplifying the drawing, a hatch is not shown in FIG. 1B.

A thermoelectric conversion element 10 show in FIGS. 1A to 1C is basically constituted with a first substrate 12, a thermoelectric conversion layer 16, a pressure sensitive adhesive layer 18, a second substrate 20, and electrodes 26 and 28.

Specifically, the thermoelectric conversion layer 16 and the electrodes 26 and 28 are on the first substrate 12, the pressure sensitive adhesive layer 18 covers the thermoelectric conversion layer 16 and the electrodes 26 and 28, and the second substrate 20 is on the pressure sensitive adhesive layer 18. The electrodes 26 and 28, that is, an electrode pair is provided such that the thermoelectric conversion layer 16 is interposed between the electrodes in the substrate surface direction of the first substrate 12. In the following description, the substrate surface direction of the first substrate 12 will be simply referred to as "plane direction" as well.

As shown in FIGS. 1A to 1C, the first substrate 12 has a low thermal conduction portion 12a and a high thermal conduction portion 12b. The second substrate 20 is constituted with a sheet-like substance made of a metal in which a concave portion 20a is formed. The sheet-like substance includes a plate, a film, foil, and the like.

As will be described later, the thermoelectric conversion element and the thermoelectric conversion module of the present invention has a constitution in which the high thermal conduction portion 12b of the first substrate 12 and the concave portion 20a of the second substrate 20 at least partially overlap each other in the plane direction.

The first substrate 12 of the thermoelectric conversion element 10 has a constitution in which the rectangular sheet-like high thermal conduction portion 12b is laminated on the surface of the rectangular sheet-like low thermal conduction portion 12a. In the example shown in the drawing, the high thermal conduction portion 12b is provided such that it covers substantially the entirety of the half of the surface of the low thermal conduction portion 12a. Furthermore, in a direction along which the electrodes 26 and 28 separate from each other, that is, in a direction along which electricity is conducted, the end of the high thermal conduction portion 12b is positioned at the center of the first substrate 12.

Accordingly, one surface of the first substrate 12 is constituted with the low thermal conduction portion 12a, which occupies about the half of the region in the plane direction, and the high thermal conduction portion 12b which occupies the other half of the region. In addition, the entirety of the other surface of the first substrate 12 is constituted with the low thermal conduction portion 12a.

In the thermoelectric conversion element of the present invention, for the first substrate, in addition to the constitution in which the high thermal conduction portion is laminated on the surface of the low thermal conduction portion, various constitutions can be used.

Figure 4A:
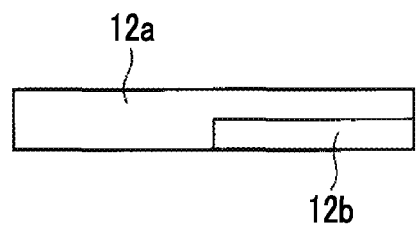
FIGS. 4A and 4B are conceptual views showing another example of a first substrate used in the thermoelectric conversion element of the present invention.

For example, the first substrate may have a constitution in which the first substrate covers the entirety of the half of the surface of the low thermal conduction portion 12a. As conceptually shown in FIG. 4A, the first substrate may have a constitution in which a concave portion is formed in the half of the region of one surface of a sheet-like substance that will become the low thermal conduction portion 12a, and the high thermal conduction portion 12b is incorporated into the concave portion so as to form a uniform surface.

As the low thermal conduction portion 12a, it is possible to use sheet-like substances formed of various materials such as a glass plate, a ceramic plate, and a resin film, as long as the substances have insulating properties and heat resistance sufficient for forming the thermoelectric conversion layer 16, the electrode 26, and the like.

A resin film is preferably used as the low thermal conduction portion 12a. It is preferable to use a resin film as the low thermal conduction portion 12a, because then weight lightening or cost reduction can be achieved, and the thermoelectric conversion element 10 having flexibility can be formed.

Examples of the resin film that can be used as the low thermal conduction portion 12a include films formed of a polyester resin such as polyethylene terephthalate, polyethylene isophthalate, polyethylene naphthalate, polybutylene terephthalate, poly(1,4-cyclohexylenedimethylene-terephthalate), or polyethylene-2,6-phthalenedicarboxylate, a resin such as polyimide, polycarbonate, polypropylene, polyether sulfone, a cycloolefin polymer, polyether ether ketone (PEEK), or triacetyl cellulose (TAC), glass epoxy, liquid crystal polyester, and the like.

Among these, in view of thermal conductivity, heat resistance, solvent resistance, ease of availability, economic efficiency, and the like, a film formed of polyimide, polyethylene terephthalate, polyethylene naphthalate, or the like is suitably used.

As the high thermal conduction portion 12b, for example, sheet-like substances formed of various materials can be used as long as the thermal conductivity thereof is higher than the thermal conductivity of the low thermal conduction portion 12a.

Specifically, in view of thermal conductivity and the like, examples of the substances include various metals such as gold, silver, copper, and aluminum. Among these, in view of thermal conductivity, economic efficiency, and the like, Cu, Al, and an alloy containing these metals are suitably used.

In the present invention, the thickness of the first substrate 12, the thickness of the high thermal conduction portion 12b, and the like may be appropriately set according to the materials forming the high thermal conduction portion 12b and the low thermal conduction portion 12a, the size of the thermoelectric conversion element 10, and the like. The thickness of the first substrate 12 is the thickness of only the low thermal conduction portion 12a in a region free of the high thermal conduction portion 12b.

The shape or size of the first substrate 12 in the plane direction, the shape or the area ratio of the high thermal conduction portion 12b within the first substrate 12 in the plane direction, and the like may also be appropriately set according to the materials forming the low thermal conduction portion 12a and the high thermal conduction portion 12b, the size of the thermoelectric conversion element 10, and the like. The size of the first substrate 12 in the plane direction is, in other words, the size of the first substrate 12 determined when the substrate is seen in a direction orthogonal to the substrate surface.

Moreover, the position of the high thermal conduction portion 12b in the plane direction within the first substrate 12 is not limited to the example shown in the drawing, and various positions can be adopted.

For example, within the first substrate 12, a portion of the high thermal conduction portion 12b may be positioned at the end of the first substrate 12 in the plane direction, and other regions may be included in the first substrate 12. In addition, the first substrate 12 may have a plurality of high thermal conduction portions 12b in the plane direction.

In a preferred aspect in which a temperature difference is easily caused between the first substrate 12 and the second substrate 20, within the thermoelectric conversion element 10 shown in FIGS. 1A to 1C, the high thermal conduction portion 12b in the first substrate 12 is positioned on the outside in the lamination direction.

However, in addition to this, the present invention may also have a constitution in which the high thermal conduction portion 12b of the first substrate 12 is positioned on the inside in the lamination direction. In a case where the high thermal conduction portion 12b is formed of a conductive material such as a metal and positioned on the inside in the lamination direction, in order for insulating properties to be able to be established between the thermoelectric conversion layer 16 and the electrodes 26 and 28, an insulating layer or the like needs to be formed between these.

In the thermoelectric conversion element 10, if necessary, an adhesive layer may be provided on the surface of the first substrate 12 on which the high thermal conduction portion 12b is not formed. In a case where the thermoelectric conversion element 10 has the adhesive layer, the adhesiveness between the first substrate 12 and the electrodes 26 and 28 is improved, and hence a thermoelectric conversion element (thermoelectric conversion module) having excellent mechanical strength such as bending resistance is obtained.

As the adhesive layer, various substances can be used according to the materials forming the first substrate 12 (low thermal conduction portion 12a), the thermoelectric conversion layer 16, and the electrodes 26 and 28, as long as the substances cart establish the adhesiveness between the thermoelectric conversion layer 16 or the two electrodes and the first substrate 12.

For example, in a case where nickel or a nickel alloy is used as the material forming the thermoelectric conversion layer 16, or in a ease where nickel, a nickel alloy, aluminum, an aluminum alloy, platinum, or the like is used as the material forming the electrodes 26 and 28, examples of the adhesive layer include a layer formed of silicon oxide ($SiO_2$), aluminum oxide ($Al_2O_3$), titanium oxide ($TiO_2$), chromium, titanium, and the like.

In a case where the adhesive layer is formed of a metal oxide such as silicon oxide, the adhesive layer can also function as a gas barrier layer that protects the thermoelectric conversion layer 16 from moisture passing through the first substrate 12.

The thickness of the adhesive layer may be appropriately set according to the material forming the adhesive layer such that an intended adhesion of the thermoelectric conversion layer 16 or electrode 26 and the electrode 28 is obtained.

The adhesive layer may be formed by a known method according to the material forming the adhesive layer. For example, in a case where the adhesive layer is formed of a metal, an alloy, a metal oxide, or the like, the adhesive layer may be formed by a vapor-phase film formation method such as vacuum vapor deposition, sputtering, or plasma CND.

In the thermoelectric conversion element 10, on the surface of the first substrate 12 on which the high thermal conduction portion 12b is not formed, the thermoelectric conversion layer 16 and the electrodes 26 and 28 are provided.

The thermoelectric conversion element is heated by, for example, contacting a heat source and the like, and hence a temperature difference is caused. According to the temperature difference, a difference of carrier density is caused in the direction of the temperature difference inside the thermoelectric conversion layer 16, and hence electric power is generated. In the example shown in the drawing, for example, a heat source is provided on the first substrate 12 side such that a temperature difference is caused between the first substrate 12 (particularly, the high thermal conduction portion 12b) and the second substrate 20, and in this way, electric power is generated. Furthermore, by connecting wiring to the electrodes 26 and 28, the electric power ((electric energy) generated by heating or the like is extracted.

In the thermoelectric conversion element 10 of the present invention, for the thermoelectric conversion layer 16, various constitutions using known thermoelectric conversion materials can be used. Accordingly, the thermoelectric conversion layer 16 may be a substance using an organic thermoelectric conversion material or an inorganic thermoelectric conversion material.

Examples of the thermoelectric conversion materials used for the thermoelectric conversion layer 16 suitably include an organic material such as a conductive polymer or a conductive nanocarbon material.

Examples of the conductive polymer include a polymer compound having a molecular structure of a conjugated system (conjugated system polymer). Specific examples thereof include known π-conjugated polymers such as polyaniline, polyphenylene vinylene, polypyrrole, polythiophene, polyfluorene, acetylene, polyphenylene, and the like. Particularly, polydioxythiophene can be suitably used.

Specific examples of the conductive nanocarbon material include carbon nanotubes, carbon nanofiber, graphite, graphene, carbon nanoparticles, and the like. One kind of these may be used singly, or two or more kinds thereof may be used in combination. In the following description, carbon nanotubes are referred to as "CNT" as well.

Among the above materials, CNT is preferably used because then thermoelectric conversion characteristics are further improved.

CNT is categorized into single-layer CNT consisting of one sheet of carbon film (graphene sheet) wound in the form of a cylinder, double-layer CNT consisting of two graphene sheets wound in the form of concentric circles, and multilayer CNT consisting of a plurality of graphene sheets wound in, the form of concentric circles. In the present invention, each of the single-layer CNT, the double-layer CNT, and the multilayer CNT may be used singly, or two or more kinds thereof may be used in combination. Particularly, the single-layer CNT and the double-layer CNT excellent in conductivity and semiconductor characteristics are preferably used, and the single-layer CNT is more preferably used.

The single-layer CNT may be semiconductive or metallic. Furthermore, semiconductive CNT and metallic CNT may be used in combination. In a case where both of the semiconductive CNT and the metallic CNT are used, a content ratio between the CNTs in a composition can be appropriately adjusted according to the use of the composition. In addition, CNT may contain a metal or the like, and CNT containing fullerene molecules and the like may be used.

CNT may be modified or treated. In a case where CNT is used in the thermoelectric conversion layer 16, CNT may contain a dopant (acceptor)

Examples of the thermoelectric conversion material constituting the thermoelectric conversion layer 16 suitably include nickel or a nickel alloy.

As the nickel alloy, it is possible to use various nickel alloys generating electric power by causing a temperature difference. Specific examples of the nickel alloy include nickel alloys mixed with one component or two or more components among vanadium, chromium, silicon, aluminum, titanium, molybdenum, manganese, zinc, tin, copper, cobalt, iron, magnesium, and zirconium.

In a case where nickel or a nickel alloy is used in the thermoelectric conversion layer 16, the content of nickel in the thermoelectric conversion layer 16 is preferably 90 at %, and more preferably equal to or greater than 95 at %. It is particularly preferable that the thermoelectric conversion layer 16 is formed of nickel. The thermoelectric conversion layer 16 formed of nickel includes a thermoelectric conversion layer containing unavoidable impurities.

In the thermoelectric conversion element 10 of the present invention, a thickness of the thermoelectric conversion layer 16, a size of the thermoelectric conversion layer 16 in the plane direction, a proportion of an area of the thermoelectric conversion layer 16 in the substrate along the plane direction, and the like may be appropriately set according to the material forming the thermoelectric conversion layer 16, the size of the thermoelectric conversion element 10, and the like.

In the thermoelectric conversion element 10 shown in the drawing, the thermoelectric conversion layer 16 is formed such that the center of the direction along which the electrodes 26 and 28 separate from each other coincides with the border line between the high thermal conduction portion 12b and the low thermal conduction portion 12a of the first substrate 12.

The thermoelectric conversion layer 16 described above is connected to the electrodes 26 and 28 such that the thermoelectric conversion layer 16 is interposed between the electrodes in the plane direction. In the thermoelectric conversion element 10, the electrodes 26 and 28 are connected to the thermoelectric conversion layer 16 in a state where the ends of the electrodes are covered with the thermoelectric conversion layer 16.

The electrodes 26 and 28 can be formed of various materials as long as the electrodes have necessary electric conductivity.

Specific examples thereof include a metal material such as copper, silver, gold, platinum, nickel, aluminum, constantan, chromium, indium, iron, or a copper alloy, a material used as a transparent electrode in various devices such as indium tin oxide (ITO) or zirconium oxide (ZnO), and the like. Among these, copper, gold, silver, platinum, nickel, a copper alloy, aluminum, constantan, and the like are preferable, and copper, gold, silver, platinum, and nickel are more preferable.

The electrodes 26 and 28 may be laminated electrodes having, for example, a constitution in which a copper layer is formed on a chromium layer.

The thickness, size, shape, and the like of the electrodes 26 and 28 may be appropriately set according to the thickness, size, and shape of the thermoelectric conversion layer 16, the size of the thermoelectric conversion element 10, and the like.

In the thermoelectric conversion element shown in the drawing, the electrodes 26 and 28 are connected to the thermoelectric conversion layer 16 in a state where the ends of the electrodes in their separation direction are covered with the thermoelectric conversion layer 16.

In the present invention, in addition to the above constitution, various constitution can be used for the electrodes 26 and 28. For example, as conceptually shown in FIG. 2A, the electrodes 26 and 28 may rise from the end of the thermoelectric conversion layer 16 along the end face of the thermoelectric conversion layer 16 and reach the vicinity of the end of the upper surface of the thermoelectric conversion layer 16. Furthermore, as conceptually shown in FIG. 2B, it is possible to use electrodes 26 and 28 that contact the end of the thermoelectric conversion layer 16. The electrodes 26 and 28 may have different constitutions.

In the thermoelectric conversion element 10, a pressure sensitive adhesive layer 18 is formed on the thermoelectric conversion layer 16 and the electrodes 26 and 28. The pressure sensitive adhesive layer 18 is for bonding the second substrate 20 to the thermoelectric conversion layer 16 and the electrodes 26 and 28 with a sufficient adhesion. Furthermore, the pressure sensitive adhesive layer 18 functions as an insulating layer that insulates the second substrate 20 formed of a metal material from the thermoelectric conversion layer 16 and the electrodes 26 and 28.

As the material forming the pressure sensitive adhesive layer 18, according to the material forming the thermoelectric conversion layer 16 and the electrodes 26 and 28 and the material forming the second substrate 20, it is possible to use various insulating materials that enable the thermoelectric conversion layer 16 and the electrodes 26 and 28 to be bonded to the second substrate 20.

Specific examples of the materials include an acryl resin, a urethane resin, a silicone resin, an epoxy resin, rubber, EVA, α-olefin polyvinyl alcohol, polyvinyl butyral, polyvinyl pyrrolidone, gelatin, starch, and the like. Furthermore, the pressure sensitive adhesive layer 18 may be formed using commercially available adhesives, pressure sensitive adhesives, double-sided tapes, pressure sensitive films, and the like.

The thickness of the pressure sensitive adhesive layer 18 may be appropriately set according to the material forming the pressure sensitive adhesive layer 18, a step height resulting from the thermoelectric conversion layer 16, and the like, such that the thermoelectric conversion layer 16 and the like can be bonded to the second substrate 20 with a sufficient adhesion and can be insulated from the second substrate 20. Basically, in a case where the pressure sensitive adhesive layer 18 is thin, the thermoelectric conversion performance can be improved.

Specifically, the thickness of the pressure sensitive adhesive layer 18 is preferably 5 to 100 µm, and more preferably 5 to 50 µm.

It is preferable that the thickness of the pressure sensitive adhesive layer 18 is equal to or greater than 5 µm, because then the step resulting from the thermoelectric conversion layer 16 can be sufficiently buried, excellent adhesiveness can be obtained, and sufficient insulating properties can be obtained.

The thickness of the pressure sensitive adhesive layer 18 is preferably equal to or less than 100 µm and particularly preferably equal to or less than 50 µm, because then the thermoelectric conversion element 10 (thermoelectric conversion module) can be made into a thin film, the thermoelectric conversion element 10 having excellent flexibility can be obtained, time heat resistance of the pressure sensitive adhesive layer 18 can be reduced, and a better thermoelectric conversion performance can be obtained.

If necessary, in order to improve the adhesiveness, in either or both of the interface between the thermoelectric conversion layer 16 as well as the electrodes 26 and 28 and the pressure sensitive adhesive layer 18 and the interface between the pressure sensitive adhesive layer 18 and the second substrate 20, at least one surface forming the interface may be subjected to a known surface treatment such as a plasma treatment, a UV ozone treatment, or an electron beam irradiation treatment such that the surface is modified or cleaned, The second substrate 20 is bonded to the pressure sensitive adhesive layer 18, and in this way, the thermoelectric conversion element 10 is constituted.

The second substrate 20 is a sheet-like substance formed of a metal material. Within a portion of a surface of the second substrate 20 that faces the pressure sensitive adhesive layer 18, a concave portion 20a is formed. Specifically, in the thermoelectric conversion element 10 shown in the drawing, the second substrate 20 has the same shape as the first substrate 12 in the plane direction, and the concave portion 20a having the same shape as the high thermal conduction portion 12b in the plane direction is formed in the same position as the high thermal conduction portion 12b in the plane direction.

That is, in the thermoelectric conversion element 10 shown in the drawing, the high thermal conduction portion 12b of the first substrate 12 and the concave portion 20a of the second substrate 20 completely overlap each other in the plane direction. In other words, in the thermoelectric conversion element 10 shown in the drawing, the concave portion 20a of the second substrate 20 and the region of only the low thermal conduction portion 12a of the first substrate 12 do not overlap each other at all.

Accordingly, in the example shown in the drawing, the thermoelectric conversion layer 16 is provided such that the center of the thermoelectric conversion layer 16 coincides with the boundary between the low thermal conduction portion 12a and the high thermal conduction portion 12b of the first substrate 12 and with the end of the concave portion 20a of the second substrate 20, in the direction along which the electrodes 26 and 28 separate from each other.

The second substrate 20 is formed of a metal material. Accordingly, in the second substrate 20, the thermal conductivity of the concave portion 20a forming a space is much lower than the thermal conductivity of other regions. That is, in the second substrate 20, the concave portion 20a performs the same function as the region of only the low thermal conduction portion 12a of the first substrate 12.

In the present invention, the high thermal conduction portion of the first substrate and the concave portion of the second substrate are provided in a state where the high thermal conduction portion and the concave portion at least partially overlap each other in the plane direction. In the thermoelectric conversion element 10 shown in the drawing, as a preferred aspect, the high thermal conduction portion 12b of the first substrate 12 and the concave portion 20a of the second substrate 20 completely overlap each other in the plane direction.

Therefore, in a case where a heating source is provided on the first substrate 12 side for example, between the high thermal conduction portion 12b and the region other than the concave portion 20a of the second substrate 20, a temperature difference is caused in the plane direction of the thermoelectric conversion layer 16 along the horizontal direction in FIGS. 1A to 1C. As a result, heat flows from the high thermal conduction portion 12b of the first substrate 12 to the region other than the concave portion 20a of the second substrate 20 having high thermal conductivity, and hence the heat flows in the plane direction of the thermoelectric conversion layer 16.

Consequently, due to the temperature difference caused in a long distance along the plane direction (in-plane) of the thermoelectric conversion layer 16, the thermoelectric conversion element 10 of the present invention can generate electric power with excellent efficiency.

The second substrate 20 having high thermal conductivity directly contacts the pressure sensitive adhesive layer 18 without the intervention of a substrate made of a resin, a support, or the like. That is, the second substrate 20 having high thermal conductivity is in a position close to the thermoelectric conversion layer 16. Furthermore, the second substrate 20 directly contacts the pressure sensitive adhesive layer 18, and except for the contact portion between the second substrate 20 and the pressure sensitive adhesive layer 18, the second substrate 20 is directly opened to the outside without being covered with anything.

Therefore, the loss of transferred heat that passes through the thermoelectric conversion layer 16 and reaches the second substrate 20 is extremely small, and the heat having reached the second substrate 20 is transferred to the second substrate 20 made of a metal material and then rapidly released to the outside.

As a result, an extremely big temperature difference is caused in the thermoelectric conversion layer 16 along the plane direction, and hence a great power generation capacity can be obtained.

All of various metal materials can be used as the material forming the second substrate 20.

Specific examples of the materials suitably include a metal such as copper, aluminum, silicon, or nickel and an alloy such as a copper alloy, stainless steel, or a nickel alloy.

In order to inhibit the oxidation or discoloration of the metal, (1) metal plating such as Ni, Au, or Ag, (2) rust inhibitor or antioxidant containing an organic compound such as an amine compound, (3) metal oxide, and the like may be provided on the surface of the metal.

Figure 5:
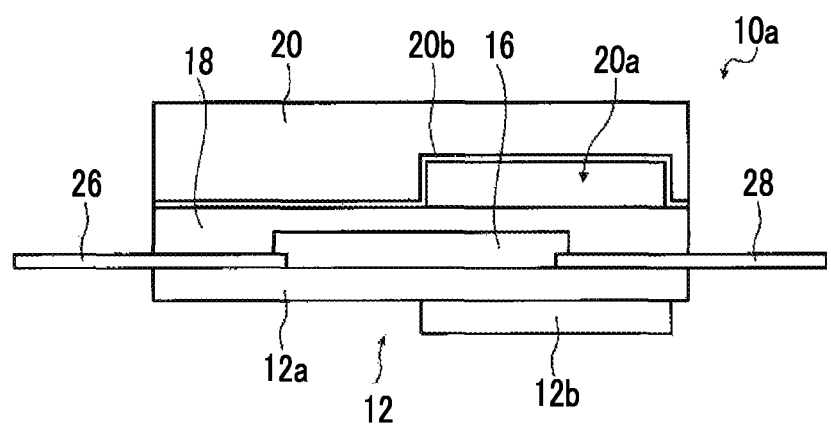
FIG. 5 is a view conceptually showing another example of the thermoelectric conversion element of the present invention.

In the present invention, as in the thermoelectric conversion element 10a conceptually shown in FIG. 5, if necessary, an insulating layer 20b may be provided on the surface of the second substrate 20 on which the concave portion 20a is not formed, that is, on the front side of the surface of the pressure sensitive adhesive layer 18 side.

The second substrate 20 is formed of a metal material. Therefore, by forming the insulating layer 20b on the front side of the surface on which the concave portion 20a is formed, the leakage of electric currents caused between the second substrate 20 and the thermoelectric conversion layer 16 can be reduced or inhibited, and an effect of improving power generation capacity is obtained.

Particularly, in a case where the thermoelectric conversion layer 16 is formed by printing, irregularities or projections causing the leakage of electric currents between the second substrate 20 and the thermoelectric conversion layer 16 easily occur on the surface of the thermoelectric conversion layer 16. Therefore, it is preferable to provide the insulating layer 20b on the front side of the surface of the second substrate 20 on which the concave portion 20a is formed. Furthermore, in a case where the thermoelectric conversion element is mounted on a curved surface such as a case where the flexible thermoelectric conversion element (thermoelectric conversion module) is mounted on a pipe-like heater, the leakage of electric currents is easily caused between the second substrate 20 and the thermoelectric conversion layer 16. Therefore, in the flexible thermoelectric conversion element, it is preferable to provide the insulating layer 20b on the front side of the surface of the second substrate 20 on which the concave portion 20a is formed.

Various known insulating materials can be used as the material forming the insulating layer 20b. Specifically, as the material forming the insulating layer 20b, it is possible to use known insulating substances such as (1) metal oxide: $SiO_2$, $Al_2O_3$, $ZrO_2$, $Ta_2O_3$, or the like, (2) metal nitride: $SiNi_x$, SiON, or the like, and (3) organic substance: para-xylylene, an epoxy resin, a polyimide resin, or a silicone resin. Among these, $SiO_2$, $Al_2O_3$, para-xylylene, and the like are suitable because these make it possible to form the insulating layer by a vapor-phase film formation method and make it easy to control the film thickness. Furthermore, for the insulating layer 20b, a mixture or a laminate of these insulating substances may be used.

The thickness of the insulating layer 20b may be appropriately set according to the material forming the insulating layer 20b such that necessary insulating properties are obtained. Specifically, the thickness of the insulating layer 20b is preferably equal to or less than 2 µm, and more preferably equal to or less than 1 µm. In a case where the thickness of the insulating layer 20b is equal to or less than 2 µm, the insulating layer 20b functions as an insulating layer that does not hinder the heat flow, and hence the power generation capacity can be suitably improved.

The shape or size of the second substrate 20 in the plane direction, the thickness of the second substrate 20, and the like may be appropriately set according to the size of the thermoelectric conversion element 10 and the like. The thickness of the second substrate 20 refers to the thick thickness of the region free of the concave portion 20a.

Furthermore, the shape, size, or position of the concave portion 20a in the plane direction, the depth of the concave portion 20a, and the like may be appropriately set according to the size of the thermoelectric conversion element 10, the position, shape, size of the high thermal conduction portion 12b of the first substrate 12, or the like, such that the concave portion 20a and the high thermal conduction portion 12b at least partially overlap each other in the plane direction.

According to the examination conducted by the inventor of the present invention, the depth of the concave portion 20a is preferably equal to or greater than 20% and more preferably equal to or greater than 50% of the thickness of the second substrate 20.

It is preferable that the depth of the concave portion 20a is equal to or greater than 20% of the thickness of the second substrate 20, because then the power generation capacity can be improved by sufficiently securing low thermal conductivity resulting from the concave portion 20a and increasing the temperature difference in the thermoelectric conversion layer 16, The thickness of the second substrate 20 is preferably equal to or greater than 0.05 mm, and more preferably equal to or greater than 0.1 mm.

It is preferable that the thickness of the second substrate 20 is equal to or greater than 0.05 mm, because then the concave portion 20a having a sufficient depth can be formed, the power generation capacity can be improved for the same reason as described above, and the stiffness of the second substrate 20 can be secured.

The thickness of the second substrate 20 is preferably equal to or less than 0.3 mm, and more preferably equal to or less than 0.2 mm.

It is preferable that the thickness of the second substrate 20 is equal to or less than 0.3 mm, because then a thermoelectric conversion element having excellent flexibility can be obtained, and a lightweight thermoelectric conversion element can be obtained.

In the second substrate 20 shown in the drawing, the concave portion 20a has a wall all around the peripheral region thereof in the plane direction. That is, the concave portion 20a is formed inside the plane of the second substrate 20.

Furthermore, in the present invention, the concave portion 20a of the second substrate 20 may have such a shape that a portion of the end of the concave portion 20a is opened to the outside. That is, the concave portion 20a may be formed by hollowing out the end face of the second substrate 20. However, in a case where the concave portion 20a is formed by hollowing out the end face of the second substrate 20, the strength of the region where the concave portion 20a is formed in the second substrate 20 is reduced, and hence the concave portion 20a is unlikely to be appropriately maintained. Accordingly, it is preferable that, in the second substrate 20, the concave portion 20a is formed inside the plane of the second substrate 20 as shown in the drawing.

In the second substrate 20, the concave portion 20a has a rectangular cross-sectional shape. That is, the concave portion 20a has a wall surface standing perpendicular to the bottom surface (ceiling surface).

Furthermore, in the present invention, the cross-sectional shape of the concave portion 20a may have a trapezoidal shape, that is, the wall surface of the concave portion 20a may have a tapered shape. Alternatively, the cross-sectional shape of the concave portion 20a may be circular or elliptical, that is, the wall surface of the concave portion 20a may be a curved surface.

In addition, if necessary, the concave portion 20a may be filled with a low thermal conduction material.

The thermoelectric conversion element 10 shown in the drawing has a constitution in which the high thermal conduction portion 12b of the first substrate 12 coincides with the concave portion 20a of the second substrate 20 in the plane direction.

In addition, various constitutions can be used for the thermoelectric conversion element of the present invention, as long as the high thermal conduction portion of the first substrate and the concave portion of the second substrate at least partially overlap each other in the plane direction. In other words, various constitutions can be used as long as the region of only the low thermal conduction portion 12a of the first substrate 12 and the concave portion 20a do not completely overlap each other in the plane direction.

For example, in the examples shown in FIGS. 1A to 1C, the high thermal conduction portion 12b of the first substrate 12 may be moved to the right in the drawings, and the concave portion 20a of the second substrate 20 may be moved to the left in the drawings, such that the end of the concave portion 20a and the end of the high thermal conduction portion 12b separate from each other in the direction along which the electrodes 26 and 28 separate from each other, and that the metal portion of the second substrate 20 and the high thermal conduction portion 12b separate from each other in the direction of heat flow.

Specifically, in the direction along which the electrodes 26 and 28 separate from each other, the end of the concave portion 20a and the end of the high thermal conduction portion 12b are separated from each other preferably by 10% to 90% and more preferably by 10% to 50% of the size of the thermoelectric conversion layer 16 in the direction along which the electrodes 26 and 28 separate from each other.

Inversely, in the example shown in FIGS. 1A to 1C, the high thermal conduction portion 12b of the first substrate 12 may be moved to the left in the drawings and the concave portion 20a of the second substrate 20 may be moved to the right in the drawings, such that the high thermal conduction portion 12b exists on the inside of the metal portion of the second substrate 20 in the direction along which the electrodes 26 and 28 separate from each other.

Figure 3A:
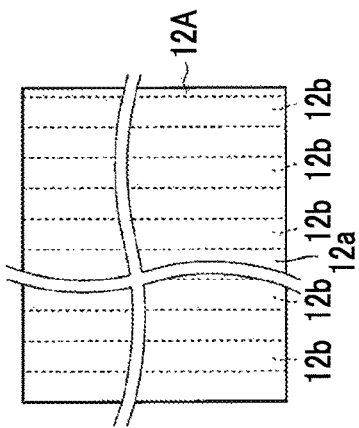
FIGS. 3A to 3E are views conceptually showing an example of a thermoelectric conversion module of the present invention using the thermoelectric conversion element of the present invention.
Figure 3B:
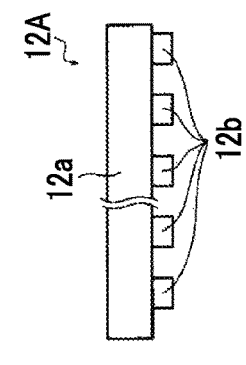
Figure 3C:
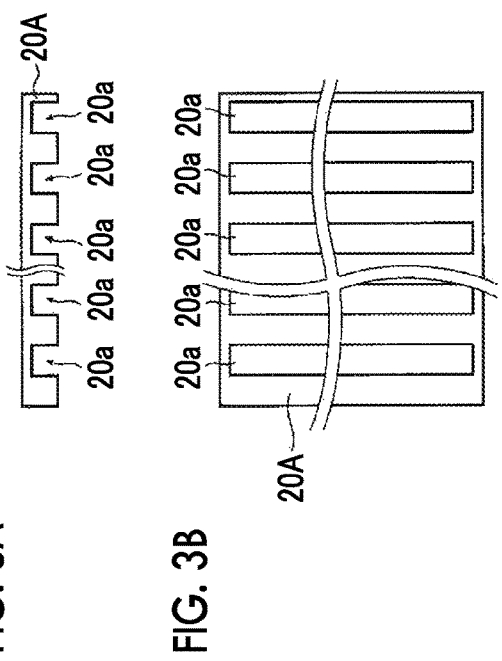
Figure 3D:
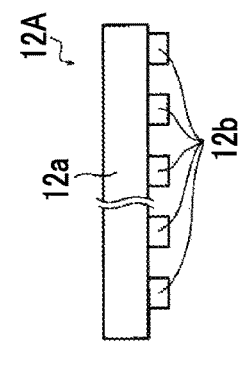
Figure 3E:
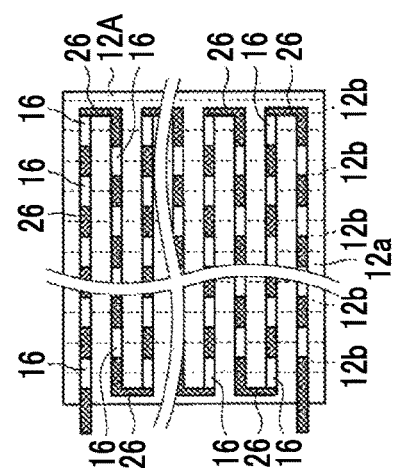

FIGS. 3A to 3E show an example of a thermoelectric conversion module of the present invention obtained by connecting in series a plurality of thermoelectric conversion elements 10 of the present invention described above. FIG. 3A is a front view, FIG. 3B is a bottom view, FIGS. 3C and 3D are top views, and FIG. 3E is a front view. Although FIG. 3A shows a cross-section obtained when FIG. 3B is cut along the horizontal direction in the drawing, a hatch is not shown in FIG. 3A for simplifying the drawing.

As shown in FIGS. 3D and 3E, a first substrate 12A has a constitution in which on the surface of a rectangular sheet-like low thermal conduction material, long square prism-like high thermal conduction portions 12b are arranged at an interval, which equals to the width of the surface contacting the low thermal conduction portions, in a direction orthogonal to the longitudinal direction.

That is, the first substrate 12A has a constitution in which the entirety of one surface of the substrate is occupied by the low thermal conduction portions 12a, and the other surface thereof is occupied by the low thermal conduction portions 12a and high thermal conduction portions 12b long m one direction and having the same width are alternately formed at an equal interval in a direction orthogonal to the longitudinal direction.

Figure 4B:
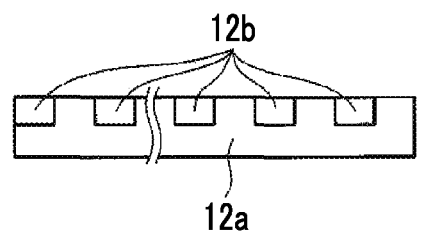

In the present example, the first substrate can also adopt various constitutions other than the constitution in which the high thermal conduction portions are disposed on the surface of the low thermal conduction portions. For example, as conceptually shown in FIG. 4B, the first substrate may have a constitution in which in a rectangular sheet-like low thermal conduction material, grooves long in one direction are formed in a direction orthogonal to the longitudinal direction at an interval which equals to the width of the grooves, and a high thermal conduction material is incorporated into the grooves. In the example shown in FIG. 4B, long grooves are formed in a direction orthogonal to the paper.

As conceptually shown in FIGS. 3C and 3D, each of the thermoelectric conversion layers 16 has a rectangular surface shape and is formed on a surface, which is totally occupied by the low thermal conduction portion 12a, of the first substrate 12A in a state where the center of each thermoelectric conversion layer 16 coincides with the boundary between the low thermal conduction portion 12a and the high thermal conduction portion 12b in the plane direction. In the example shown in the drawing, the size of each thermoelectric conversion layer 16 in die horizontal direction in FIG. 3C is the same as the width of each high thermal conduction portion 12b. In the following description, the horizontal direction in FIG. 3C will be simply referred to as "horizontal direction" as well. In other words, the horizontal direction is a direction in which the low thermal conduction portions 12a and the high thermal conduction portions 12b are alternately arranged.

The thermoelectric conversion layers 16 are formed in the horizontal direction at an equal interval on every other boundary between the low thermal conduction portion 12a and the high thermal conduction portion 12b. That is, the thermoelectric conversion layers 16 are formed at an equal interval that is the same as the width of each high thermal conduction portion 12b in the horizontal direction. As described above, the size of each thermoelectric conversion layer 16 in the horizontal direction is the same as the width of each high thermal conduction portion 12b.

Furthermore, the thermoelectric conversion layers 16 are two-dimensionally formed, such that lines of the thermoelectric conversion layers 16 arranged at an equal interval in the horizontal direction are arranged at an equal interval in a vertical direction in FIG. 3C. In the following description, the vertical direction in FIG. 3C will be simply referred to as "vertical direction" as well. In other words, the vertical direction is the longitudinal direction of the low thermal conduction portions 12a and the high thermal conduction portions 12b.

In addition, as shown in FIG. 3C, within the arrays of the thermoelectric conversion layers 16 in the horizontal direction, the lines adjacent to each other in the vertical direction are formed such that they deviate from each other in the horizontal direction by the width of each high thermal conduction portion 12b. That is, in the lines adjacent to each other in the vertical direction, the thermoelectric conversion layers 16 are formed such that they alternate with each other by the width of each high thermal conduction portion 12b.

The thermoelectric conversion layers 16 are connected to each other in series through the electrodes 26 (electrode 28). For clearly showing the constitution, the electrodes 26 are shaded. Specifically, as shown in FIG. 3C, in the arrays of the thermoelectric conversion layers 16 in the horizontal direction in the drawing, the electrodes 26 are provided such that each of the thermoelectric conversion layers 16 is interposed between the electrodes in the horizontal direction. As a result, the thermoelectric conversion layers 16 arranged in the horizontal direction are connected to each other in series through the electrodes 26.

Furthermore, at the end of the thermoelectric conversion layers 16 in the horizontal direction, the thermoelectric conversion layers 16 in lines adjacent to each other in the vertical direction are connected to each other through the electrode 26. When the thermoelectric conversion layers 16 are connected to each other in the vertical direction through the electrode 26 at the end of the line in the horizontal direction, the thermoelectric conversion layer 16 at one end is connected to the thermoelectric conversion layer 16 at the end of an upper line that is on the same side as the one end, and the thermoelectric conversion layer 16 at the other end is connected to the thermoelectric conversion layer 16 at the end of a lower line that is on the same side as the other end.

As a result, all of the thermoelectric conversion layers 16 are connected to each other in series in the horizontal direction such that they look like a single line that is folded plural times.

As shown in FIGS. 3A and 3B, the second substrate 20A has a constitution in which long groove-like concave portions 20a, which include the region where the thermoelectric conversion layers 16 are formed and extend in the vertical direction, are arranged at an equal interval in a direction orthogonal to the longitudinal direction.

The arrangement interval of the concave portions 20a is the same as the width of each concave portion 20a. Furthermore, the width, that is, the arrangement interval of the concave portion 20a equals to the width of each high thermal conduction portion 12b of the first substrate 12, that is, the arrangement interval of the high thermal conduction portions 12b.

As conceptually shown in FIGS. 3B and 3C, the second substrate 20A is laminated on the thermoelectric conversion layers 16 and the electrodes 26, the surface on which the groove-like concave portions 20a are formed down, such that the high thermal conduction portions 12b of the first substrate 12A coincide with the concave portions 20a in the horizontal direction. Accordingly, in the region where the thermoelectric conversion layers 16 are formed, the high thermal conduction portions 12b of the first substrate 12A and the concave portions 20a coincide with each other in the plane direction, In this way, a thermoelectric conversion module in which a large number of thermoelectric conversion elements 10 of the present invention are connected to each other in series is constituted.

Before the second substrate 20A is laminated, the pressure sensitive adhesive layer 18 is formed on the thermoelectric conversion layers 16 and the electrodes 26 such that the entire surface of the first substrate 12A is covered, although the pressure sensitive adhesive layer 18 is not shown in the drawings.

At the time of bonding the thermoelectric conversion module (thermoelectric conversion element) of the present invention to a heat source and generating power, a thermally conductive adhesive sheet or a thermally conductive adhesive may be used.

The thermally conductive adhesive sheet and the thermally conductive adhesive used by being bonded to a heating side or a cooling side of the thermoelectric conversion module are not particularly limited. Accordingly, commercially available thermally conductive adhesive sheets or thermally conductive adhesives can be used. As the thermally conductive adhesive sheet, for example, it is possible to use TC-50TXS2 manufactured by Shin-Etsu Silicone, a hyper soft heat dissipating material 5580H manufactured by Sumitomo 3M, Ltd., BFG20A manufactured by Denka Company Limited., TR5912F manufactured by NITTO DENKO CORPORATION, and the like. From the viewpoint of heat resistance, a thermally conductive adhesive sheet formed of a silicone-based pressure sensitive adhesive is preferable. As the thermally conductive adhesive, for example, it is possible to use SCOTCH-WELD EW2070 manufactured by 3M, TA-01 manufactured by Ainex Co., Ltd., TCA-4105, TCA-4210, and HY-910 manufactured by Shiima Electronics, SST2-RSMZ, SST2-RSCSZ, R3CSZ, and R3MZ manufactured by SATSUMASOKEN CO., LTD., and the like.

The use of the thermally conductive adhesive sheet or the thermally conductive adhesive brings about an effect of increasing a surface temperature of the heating side of the thermoelectric conversion module by improving the adhesiveness with respect to the heat source, an effect of being able to reduce a surface temperature of the cooling side of the thermoelectric conversion module by improving the cooling efficiency, and the like, and accordingly, a power generation capacity can be improved.

On the surface of the cooling side of the thermoelectric conversion module, a heat dissipating fin (heatsink) or a heat dissipating sheet formed of a known material such as stainless steel, copper, or aluminum may be provided. It is preferable to use the heat dissipating tin, because then a low-temperature side of the thermoelectric conversion module can be more suitably cooled, a big temperature difference is caused between the heat source side and the cooling side, and the thermoelectric conversion efficiency is further improved.

In the thermoelectric conversion module (thermoelectric conversion element) of the present invention, generally, the second substrate 20A side becomes a cooling side, As the heat dissipating fin, it is possible to use various known fins such as T-Wing manufactured by TAIYO WIRE, CLOTH CO., LTD, FLEXCOOL manufactured by SHI-GYOSOZO KENKYUSHO, a corrugated fin, an offset fin, a waving fin, a slit fin, and a folding fin. Particularly, it is preferable to use a folding fin having a fin height.

The heat dissipating fin preferably has a fin height of 10 to 56 mm, a fin pitch of 2 to 10 mm, and a plate thickness of 0.1 to 0.5 mm. The fin height is more preferably equal to or greater than 25 mm, because then the heat dissipating characteristics are improved, the module can be cooled, and hence the power generation capacity is improved. It is preferable to use a heat dissipating fin made of aluminum having a plate thickness of 0.1 to 0.3 mm, because such a fin is highly flexible and lightweight.

As the heat dissipating sheet, it is possible to use known heat dissipating sheets such as a PSG graphite sheet manufactured by Panasonic Corporation, COOL STAFF manufactured by Oki Electric Cable Co., Ltd., and CERAC a manufactured by CERAMISSION CO., LTD.

By forming irregularities on the surface of the second substrate 20A on which the concave portions 20a are not formed, the area of the surface may be increased, or heat dissipation efficiency may be improved.

The irregularities may be formed by a known method such as a surface roughening treatment.

Hereinafter, an example of a method for manufacturing the thermoelectric conversion element 10 shown in FIGS. 1A to 1C will be described. Basically, the thermoelectric conversion module shown in FIGS. 3A to 3E can be manufactured in the same manner.

First, the first substrate 12 having the low thermal conduction portions 12a and the high thermal conduction portions 12b and the second substrate made of a metal material having the concave portions 20a are prepared.

For example, regarding the first substrate 12, by bonding a sheet-like (or belt-like) high thermal conduction portion 12b to a sheet-like substance that will become the low thermal conduction portion 12a, the first substrate 12 in which the high thermal conduction portion 12b is laminated on the low thermal conduction portion 12a may be prepared. Alternatively, by preparing a sheet-like substance, which is obtained by forming a layer to be the high thermal conduction portion 12b on the entire surface of a sheet-like substance to be the low thermal conduction portion 12a, and removing an unnecessary portion by performing etching on the layer to be the high thermal conduction portion 12b, the first substrate 12 in which the high thermal conduction portion 12b is laminated on the low thermal conduction portion 12a may be prepared.

The second substrate 20 may be prepared by, for example, forming the concave portions 20a by directly processing a metal plate through wet etching, dry etching, electric discharge machining, sand blasting, or the like.

Alternatively, by bonding metal foil to a metal plate through diffusion bonding, brazing, welding, or the like, the second substrate 20 made of a metal material having the concave portions 20a may be prepared.

Next, in the position corresponding to the thermoelectric conversion layers 16, the electrodes 26 and 28 are formed such that each thermoelectric conversion layer 16 is interposed between the electrodes in the plane direction.

The electrodes 26 and 28 may be formed by a known method such as a vacuum vapor deposition method using a metal mask, according to the material forming the electrodes 26 and 28 and the like.

Then, m an intended position on the surface of the first substrate 12 that is completely occupied by the low thermal conduction portions 12a, the thermoelectric conversion layers 16 are formed. In the thermoelectric conversion element 10 shown in the drawing, the thermoelectric conversion layers 16 are formed such that they cover the ends of the electrodes 26 and 28.

The thermoelectric conversion layers 16 may be formed by a known method according to the thermoelectric conversion material used.

For example, it is possible to use a method of preparing a coating composition containing a thermoelectric conversion material and a binder, coating the substrate with the coating composition by means of patterning by a known method such as screen printing or ink jet, drying the coating composition, and curing the binder, thereby forming thermoelectric conversion layers in which the thermoelectric conversion material is dispersed in the binder.

In a case where CNT is used as a thermoelectric conversion material, for example, it is possible to use a method of preparing a coating composition by dispersing CNT in water by using a dispersant (surfactant), coating the substrate with the coating composition by means of patterning by a known method in the same manner as described above, and drying the coating composition, thereby forming thermoelectric conversion layers mainly composed of CNT and a surfactant. At this time, after the coating composition is dried, it is preferable to remove the dispersant by washing the thermoelectric conversion layers with a washer that dissolves the dispersant such as an alcohol and then dry the washer such that thermoelectric conversion layers substantially solely composed of CNT are obtained. The washing may be performed by a method of impregnating the thermoelectric conversion layers with the washer, a method of rinsing the thermoelectric conversion layers with the washer, and the like.

In a case where nickel or a nickel alloy is used as a thermoelectric conversion material, for example, it is possible to use a method of forming patterns of the thermoelectric conversion layers composed of nickel or a nickel alloy by means of a vapor-phase film formation method such as vacuum vapor deposition or sputtering through a known method using a metal mask or the like.

Alternatively, by forming the thermoelectric conversion layers on the entire surface of the first substrate 12 and performing etching, the thermoelectric conversion layers 16 may be formed by patterning.

Then, by forming the pressure sensitive adhesive layer 18 on the surface of the prepared second substrate 20 on which the concave portions 20a are formed and laminating and bonding the second substrate 20 to the first substrate 12 in a state where the pressure sensitive adhesive layer 18 faces the thermoelectric conversion layers 16, the thermoelectric conversion element 10 is prepared.

The pressure sensitive adhesive layer 18 may be formed on the second substrate 20 by a known method such as a method of coating the substrate with an adhesive and drying the adhesive or bonding a pressure sensitive adhesive, a double-sided tape, a pressure sensitive film or the like to the second substrate 20. After the pressure sensitive adhesive layer 18 is formed on the second substrate 20, it is preferable to diffuse air bubbles between the second substrate 20 and the pressure sensitive adhesive layer 18 to the pressure sensitive adhesive layer 18 by applying pressure by using an autoclave or the like.

In the aforementioned example, the electrodes 26 and 28 are formed, and then the thermoelectric conversion layers 16 are formed. However, the thermoelectric conversion layers 16 and the electrodes 26 and 28 may be formed in reverse order.

Figure 2A:
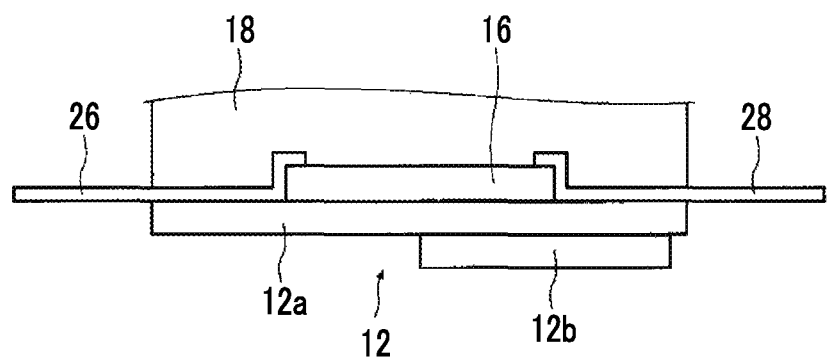
FIGS. 2A and 2B are views conceptually showing another example of the thermoelectric conversion element of the present invention.
Figure 2B:
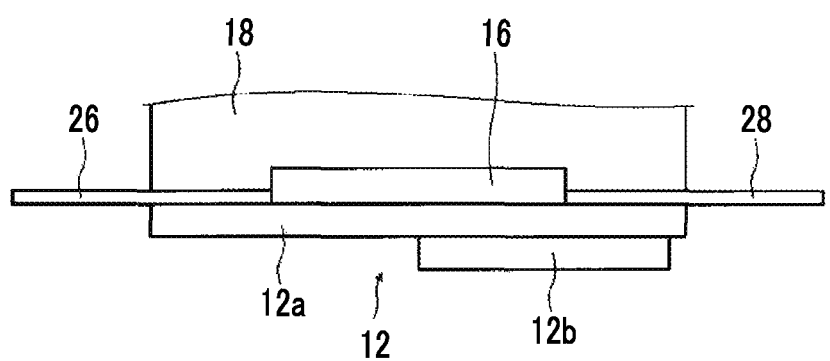

In this case, as in the thermoelectric conversion layer 16 conceptually shown in FIG. 2A, the constitution may be adopted in which the electrodes 26 and 28 reach the upper surface of the thermoelectric conversion layer.

The thermoelectric conversion element and the thermoelectric conversion module of the present invention described above can be used for various purposes.

For example, they can be used for electric power generation in various ways, such as power generators including a hot spring heat power generator, a solar power generator, and a waste heat power generator or power sources of various devices including a power source for a wristwatch, a power source for driving a semiconductor, and a power source for a small sensor. Furthermore, the thermoelectric conversion element of the present invention can also be used not only for electric power generation but also for a sensor element such as a thermal sensor or a thermocouple.

Hitherto, the thermoelectric conversion element and the thermoelectric conversion module of the present invention as well as the manufacturing methods thereof have been specifically described, but the present invention is not limited to the examples described above. It goes without saying that the present invention may be ameliorated or modified in various ways within a scope that does not depart from the gist of the present invention.

EXAMPLES

Hereinafter, the thermoelectric conversion element and the thermoelectric conversion module of the present invention will be more specifically described by illustrating specific examples of the present invention. However, the present invention is not limited to the following examples.

Example 1

An adhesive-free double-sided copper-clad polyimide substrate (FELIOS R-F775, manufactured by Panasonic Electric Works Co., Ltd.) was prepared. The copper-clad polyimide substrate had a size of 110×80 mm, the thickness of the polyimide layer was 20 µm, and the thickness of the Cu layer was 70 µm.

By an etching treatment, the copper layer on one surface of the double-sided copper-clad polyimide substrate was completely removed.

Then, by etching the remaining copper layer of the copper-clad polyimide substrate from which the copper layer on one surface was removed, copper stripe patterns having a width of 0.5 mm were formed at an interval of 0.5 mm.

In this way, a first substrate shown in FIGS. 3D and 3E was prepared in which belt-like high thermal conduction portions each having a thickness of 70 µm and a width of 0.5 mm were arranged at an interval of 0.5 mm in a direction orthogonal to the longitudinal direction on the surface of sheet-like low thermal conduction portions having a thickness of 20 µm.

Meanwhile, copper foil having a size of 80×80 mm and a thickness of 0.2 mm was prepared.

By performing an etching treatment on the copper foil, groove-like concave portions having a depth of 0.075 mm and a width of 0.5 mm were formed in the form of stripes at an interval of 0.5 mm.

In this way, the second substrate 20 made of copper having a thickness of 0.2 mm shown in FIGS. 3A and 3B was prepared in which the groove-like concave portions each having a depth of 0.075 mm and a width of 0.5 mm are provided at an interval of 0.5 mm in a direction orthogonal to the longitudinal direction.

On the entirety of one surface (flat surface) of the first substrate that was solely composed of polyimide, an adhesive layer composed of chromium having a thickness of 0.05 µm was formed by a vacuum vapor deposition method. Then, by a vacuum vapor deposition method, electrodes composed of copper having a thickness of 0.5 µm were formed. The electrodes were formed by patterning by using a metal mask.

Then, by a vacuum vapor deposition method, thermoelectric conversion layers composed of nickel having a thickness of 1 µm were formed such that the ends of the electrode in their separation direction were covered. As the thermoelectric conversion layers, 1,785 patterns each having a size of 0.5×1.5 mm were formed using a metal mask.

Meanwhile, onto the surface of the second substrate on which the concave portion was formed, a pressure sensitive adhesive (double-sided tape No. 5630, manufactured by NITTO DENKO CORPORATION) having a thickness of 30 µm was bonded, followed by an autoclave treatment for 20 minutes at 0.4 MPa and 40° C.

The second substrate treated in the autoclave was laminated and bonded onto the first substrate on which the thermoelectric conversion layers were formed, such that the longitudinal direction of the concave portions coincided with the longitudinal direction of the high thermal conduction portions, and that the horizontal direction of the concave portions overlapped the horizontal direction of the high thermal conduction portions. In this way, the thermoelectric conversion module shown in FIGS. 3A to 3E was prepared.

The prepared thermoelectric conversion module was interposed between a heated copper plate and a copper plate connected to a cold water circulation device, and a temperature of the heated copper plate was adjusted such that a temperature difference of 10° C. was caused between the two copper plates. At this time, thermally conductive grease (SCH-30, manufactured by Sunhayato Corp) was injected into the space between the thermoelectric conversion module and the copper plates such that the thermoelectric conversion module was bonded to the copper plates.

Furthermore, the electrodes of thermoelectric conversion layers of the uppermost stream that are connected to each other in series and the electrodes of the thermoelectric conversion layers of the lowermost stream were connected to a source meter (SOURCE METER 2450, manufactured by Keithley Instruments, Inc.,), an open-circuit voltage and a short-circuit current were measured, and a power generation capacity was determined by the following equation.

(Power generation capacity)=0.25×(open-circuit voltage)×(short-circuit current)

As a result, the power generation capacity was 38 μW.

Example 2

A thermoelectric conversion module was prepared in the same manner as in Example 1, except that the pressure sensitive adhesive layer was formed using a pressure sensitive adhesive (double-sided tape No. 5600, manufactured by NITTO DENKO CORPORATION) having a thickness of 5 μm.

As a result of measuring the power generation capacity in the same manner as in Example 1, the power generation capacity was 78 μW.

Example 3

A thermoelectric conversion module was prepared in the same manner as in Example 1, except that the depth of the concave portions in the second substrate was set to be 0.1 mm.

As a result of measuring the power generation capacity in the same manner as in Example 1, the power generation capacity was 93 μW.

Example 4

A thermoelectric conversion module was prepared in the same manner as in Example 1, except that copper foil having a thickness of 0.15 mm was used as the second substrate, and the depth of the concave portions of the second substrate was set to be 0.075 mm.

As a result of measuring the power generation capacity in the same manner as in Example 1, the power generation capacity was 102 μW.

Comparative Example 1

A thermoelectric conversion module was prepared in the same manner as in Example 1, except that the same substrate as the first substrate obtained by forming groove-like concave portions on copper foil was used as the second substrate, and the second substrate was laminated on the first substrate such that the longitudinal direction of the high thermal conduction portions coincided with the longitudinal direction of the first substrate and that the horizontal direction of the high thermal conduction portions did not overlap the horizontal direction of the first substrate.

As a result of measuring the power generation capacity in the same manner as in Example 1, the power generation capacity was 14 μW.

Comparative Example 2

A thermoelectric conversion module was prepared in the same manner as in Example 2, except that the same substrate as the first substrate obtained by forming groove-like concave portions on copper foil was used as the second substrate, and the second substrate was laminated on the first substrate such that the longitudinal direction of the high thermal conduction portions coincided with the longitudinal direction of the first substrate and that the horizontal direction of the high thermal conduction portions did not overlap the horizontal direction of the first substrate.

As a result of measuring the power generation capacity in the same manner as in Example 1, the power generation capacity was 32 μW.

The results obtained from the above examples are shown in the following Table 1.

TABLE 1

| | Thermoelectric conversion layer | Thickness of pressure sensitive adhesive layer [μm] | Second substrate | | Insulating layer | Power generation capacity [μW] |
| --- | --- | --- | --- | --- | --- | --- |
| | | | Thickness [mm] | Depth of groove [mm] | | |
| Example 1 | Ni (vapor deposition) | 30 | 0.2 | 0.075 | N/A | 38 |
| Example 2 | Ni (vapor deposition) | 5 | 0.2 | 0.075 | N/A | 78 |
| Example 3 | Ni (vapor deposition) | 30 | 0.2 | 0.1 | N/A | 93 |
| Example 4 | Ni (vapor deposition) | 30 | 0.15 | 0.075 | N/A | 102 |
| Comparative Example 1 | Ni (vapor deposition) | 30 | Same substrate as first substrate was used | | N/A | 14 |
| Comparative Example 2 | Ni (vapor deposition) | 5 | Same substrate as first substrate was used | | N/A | 32 |

As shown in Table 1, the thermoelectric conversion module of the present invention in which the second substrate made of copper foil having groove-like concave portions in the form of stripes can yield a higher power generation capacity, compared to the thermoelectric conversion module of the related art using the second substrate having belt-like high thermal conduction portions made of copper in the form of stripes on the sheet-like low thermal conduction portions made of polyimide.

Furthermore, as shown in Example 2, the thinner the pressure sensitive adhesive layer, the higher the power generation capacity obtained from the thermoelectric conversion module (thermoelectric conversion element) of the present invention. In addition, as shown in Examples 3 and 4, in the thermoelectric conversion module (thermoelectric conversion element) of the present invention, by setting the depth of the concave portions to be equal to or greater than 50% of the thickness of the second substrate, a higher power generation capacity is obtained.

Example 5

An adhesive-free double-sided copper-clad polyimide substrate (FELIOS R-F775, manufactured by Panasonic Electric Works Co., Ltd.) was prepared. The copper-clad polyimide substrate had a size of 110×80 mm, the thickness of the polyimide layer was 20 µm, and the thickness of the Cu layer was 70 µm.

By an etching treatment, the copper layer on one surface of the double-sided copper-clad polyimide substrate was completely removed.

Then, by etching the remaining copper layer of the copper-clad polyimide substrate from which the copper layer on one surface was removed, copper stripe patterns each having a width of 0.5 mm were formed at an interval of 0.5 mm.

In this way, a first substrate shown in FIGS. 3D and 3E was prepared in which belt-like high thermal conduction portions each having a thickness of 70 µm and a width of 0.5 mm were arranged at an interval of 0.5 mm in a direction orthogonal to the longitudinal direction on the surface of sheet--like low thermal conduction portions each having a thickness of 20 µm.

Meanwhile, copper foil having a size of 50×50 mm and a thickness of 0.2 mm was prepared.

By performing a half etching treatment on the copper foil, groove-like concave portions each having a depth of 0.075 mm and a width of 0.5 mm were made in the form of stripes at an interval of 0.5 mm. On the surface on which the concave portions were formed, a $Al_2O_3$ film was formed by an EB vapor deposition method, thereby forming an insulating layer on the surface on which the concave portions were formed.

In this way, the second substrate made of copper shown in FIG. 5 was prepared which had a thickness of 0.2 mm and groove-like concave portions each having a depth of 0.075 mm and a width of 0.5 mm in a direction orthogonal to the longitudinal direction at an interval of 0.5 mm, in which an insulating layer was formed on the surface on which the concave portions were formed.

Furthermore, onto the surface of the second substrate on which the concave portions were formed, a pressure sensitive adhesive (double-sided tape No. 5630, manufactured by NITTO DENKO CORPORATION) having a thickness of 30 µm was bonded, followed by an autoclave treatment for 20 minutes at 0.4 MPa and 40° C.

Meanwhile, in the following manner, a coating composition that will become thermoelectric conversion layers was prepared.

First, single-layer CNT (EC, manufactured by Meijo Nano Carbon, average length of CNT: equal to or greater than 1 µm) and sodium deoxycholate (manufactured by TOKYO CHEMICAL INDUSTRY CO., LTD.) were added to 20 ml of water such that a mass ratio of CNT/sodium deoxycholate became 25/75, thereby preparing a solution.

This solution was mixed for 7 minutes by using a mechanical homogenizer (manufactured by SMT Corporation, HIGH-FLEX HOMOGENIZER HF93), thereby obtaining a premix.

By using a thin film spin system high-speed mixer "FIL-MIX 40-40 model" (manufactured by PRIMIX Corporation), a dispersion treatment was performed on the obtained premix for 2 minutes at a circumferential speed of 10 m/sec and then for 5 minutes at a circumferential speed of 40 m/sec in a constant-temperature tank with a temperature of 10° C. by a high-speed spinning thin film dispersion method, thereby preparing a coating composition that will become a thermoelectric conversion layer.

By using the coating composition that will become thermoelectric conversion layers, on a surface (planar surface), which was totally occupied by a polyimide layer and onto which electrodes were vapor-deposited, of the first substrate, 1,785 patterns of the coating composition each having a size of 0.5×1.5 mm were formed at an interval of 1 mm in the longitudinal direction of the high thermal conduction portions and at an interval of 0.5 mm in the arrangement direction of the high thermal conduction portions and dried for 30 minutes at 50° C. and then for 30 minutes at 120° C. The patterns of the coating composition were formed by metal mask printing by setting a squeegee direction to be the direction in which the thermoelectric conversion elements were connected to each other in series, under the conditions of an attack angle of 20°, a clearance of 1.5 mm, a priming pressure of 0.3 MPa, and an indentation amount of 0.5 mm.

Then, the resultant was impregnated with ethanol for 1 hour so as to remove sodium deoxycholate, and dried for 30 minutes at 50° C. and then for 150 minutes at 120° C., thereby forming 1,785 thermoelectric conversion layers. The thickness of each the thermoelectric conversion layers was 5.0 µm.

Thereafter, by a vacuum film formation method using a metal mask, an aluminum film having a thickness of 200 nm was formed as an electrode and connected to the 1,785 thermoelectric conversion layers.

The second substrate treated in the autoclave was laminated and bonded onto the first substrate on which the thermoelectric conversion layers were formed, such that the longitudinal direction of the concave portions coincided with the longitudinal direction of the high thermal conduction portions and that the concave portions arid the high thermal conduction portions overlap each other in the horizontal direction. In this way, a thermoelectric conversion module shown in FIGS. 3A to 3E was prepared in which an insulating layer was formed on the concave portions of the second substrate.

As a result of measuring the power generation capacity in the same manner as in Example 1, the power generation capacity was 21 µW.

Example 6

A thermoelectric conversion module was prepared in the same manner as in Example 5, except that a second substrate that did not have an insulating layer on the surface on which the concave portions were formed was used.

As a result of measuring the power generation capacity in the same manner as in Example 1, the power generation capacity was 21 µW.

Comparative Example 3

A thermoelectric conversion module was prepared in the same manner as in Example 5, except that the same substrate as the first substrate obtained by forming groove-like concave portions on copper foil was used as the second substrate, and the second substrate was laminated on the first substrate such that the longitudinal direction of the high thermal conduction portions coincided with the longitudinal direction of the first substrate and that the horizontal direction of the high thermal conduction portions did not overlap the horizontal direction of the first substrate.

As a result of measuring the power generation capacity m the same manner as in Example 1, the power generation capacity was 9.5 µW.

The results obtained from the above examples are shown in Table 2.

Example 7

A thermoelectric conversion module was prepared in the same manner as in Example 1, except that, as a second substrate, the same second substrate as used in Example 5 was used in which an insulating layer was formed on the surface on which the concave portions were formed.

As a result of measuring the power generation capacity in the same manner as in Example 1, the power generation capacity was 38 µW.

TABLE 2

| | Thermoelectric conversion layer | Thickness of pressure sensitive adhesive layer [µm] | Second substrate | | | Power generation capacity [µW] |
| --- | --- | --- | --- | --- | --- | --- |
| | | | Thickness [mm] | Depth of groove [mm] | Insulating layer | |
| Example 5 | CNT (printing) | 30 | 0.2 | 0.075 | Al$_2$O$_3$ | 21 |
| Example 6 | CNT (printing) | 30 | 0.2 | 0.075 | N/A | 21 |
| Comparative Example 3 | CNT (printing) | 30 | Same substance as first substrate was used. | | | 9.5 |

As shown in Table 2, from the comparison of Examples 5 and 6 and Comparative Example 3, it is understood that, even in a case where a CNT layer formed by printing was used as thermoelectric conversion layers, the thermoelectric conversion module of the present invention using the second substrate made of copper foil having groove-like concave portions in the form of stripes yields a higher power generation capacity, compared to the thermoelectric conversion module of the related art in which the second substrate having the belt-like high thermal conduction portions made of copper in the form of stripes on the sheet-like low thermal conduction portions made of polyimide.

As is evident from the results obtained from Examples 5 to 6, in the present invention, even when the insulating layer is formed on the concave portions of the second substrate, a high power generation capacity can be obtained.

The results are shown in Table 3. For reference, the results obtained from Example 1 and Comparative Example 1 are also shown in Table 3.

TABLE 3

| | Thermoelectric conversion layer | Thickness of pressure sensitive adhesive layer [µm] | Second substrate | | | Power generation capacity [µW] |
| --- | --- | --- | --- | --- | --- | --- |
| | | | Thickness [mm] | Depth of groove [mm] | Insulating layer | |
| Example 1 | Ni (vapor deposition) | 30 | 0.2 | 0.075 | N/A | 38 |
| Example 7 | Ni (vapor deposition) | 30 | 0.2 | 0.075 | Al$_2$O$_3$ | 38 |
| Comparative Example 1 | Ni (vapor deposition) | 30 | Same substance as first substrate was used. | | | 14 |

As is evident from Table 3, according to the present invention, even in a case where thermoelectric conversion layers formed of Ni are used and the insulating layer is formed on the surface of the concave portions of the second substrate, a high power generation capacity can be obtained.

Example 5-2

By using a thermally conductive adhesive sheet (TC-50TXS2, manufactured by Shin-Etsu Silicone), the thermoelectric conversion module prepared in Example 5 was bonded to a pipe-like heater of ϕ80 mm. Furthermore, the thermally conductive adhesive sheet (TC-50TXS2, manufactured by Shin-Etsu Silicone) was also bonded onto the thermoelectric conversion module, and a water-cooling jacket conforming the curved surface of the thermoelectric conversion module was fixed to the module. Into the water-cooling jacket, circulating water of which the temperature was controlled was supplied.

The power generation capacity was measured in the same manner as in Example 1, except that the temperature of the pipe-like heater was set to be 40° C. and the temperature of the circulating water was set to be 25° C.

As a result, the power generation capacity was 25 μW.

Meanwhile, the thermoelectric conversion module prepared in Example 5 was interposed between thermally conductive adhesive sheets (TC-50TXS2, manufactured by Shin-Etsu Silicone), and then interposed again between a heated copper plate and a copper plate connected to a cold water circulation device.

The power generation capacity was measured in the same manner as in Example 1, except that the temperature of the heated copper plate was set to be 40° C., and the temperature of the copper plate connected to the cold water circulation device was set to be 25° C.

As a result, the power generation capacity was 25 μW.

By the following equation, a power generation capacity retention rate was calculated.

Power generation capacity retention rate=(power generation capacity obtained using pipe-like heater)/(power generation capacity obtained using copper plate)

As a result, the power generation capacity retention rate was 1.

Example 6-2

The power generation capacity was measured in the same manner as in Example 5-2, and the power generation capacity retention rate was calculated in the same manner as in Example 5-2, except that the thermoelectric conversion module prepared in Example 6 was used.

As a result, the power generation capacity obtained using the pipe-like heater was 21.3 μW, the power generation capacity obtained using the copper plate was 25 μW, and the power generation capacity retention rate was 0.85.

Example 1-2

The power generation capacity was measured in the same manner as in Example 5-2, and the power generation capacity retention rate was calculated in the same manner as in Example 5-2, except that the thermoelectric conversion module prepared in Example 1 was used.

As a result, the power generation capacity obtained using the pipe-like heater was 41 μW, the power generation capacity obtained using the copper plate was 41 μW, and the power generation capacity retention rate was 1.

The results are shown in Table 4.

As shown in Table 4, from the comparison of Examples 5-2 and 6-2, it is understood that, by forming the insulating layer on the surface of the concave portions of the second substrate, compared to the power generation capacity obtained from the planar thermoelectric conversion module, the power generation capacity retention rate obtained from the curved thermoelectric conversion module generating electric power by using a pipe heater can be retained at a higher rate.

Furthermore, from the fact that the power generation capacity retention rate of Example 1-2 using vapor-deposited Ni as thermoelectric conversion layers is 1, it is understood that the effect of the insulating layer is suitably demonstrated in a case where the thermoelectric conversion layers are formed by printing.

The above results clarify the effects of the present invention.

EXPLANATION OF REFERENCES 10, 10a: thermoelectric conversion element
12: first substrate
12a: low thermal conduction portion
12b: high thermal conduction portion
16: thermoelectric conversion layer
18: pressure sensitive adhesive layer
20: second substrate
20a: concave portion
20b: insulating layer
26, 28: electrode

What is claimed is:
1. A thermoelectric conversion element comprising:
a first substrate having a high thermal conduction portion which has a thermal conductivity higher than a thermal conductivity of other regions in at least a portion in a plane direction;
a thermoelectric conversion layer formed on the first substrate;
a pressure sensitive adhesive layer formed on the thermoelectric conversion layer;
a second substrate formed on the pressure sensitive adhesive layer, having a concave portion, which at least partially overlaps the high thermal conduction portion in the plane direction and is on the pressure sensitive adhesive layer side, and made of a metal material; and
an electrode pair connected to the thermoelectric conversion layer such that the thermoelectric conversion layer is interposed between the electrodes in the plane direction.

TABLE 4

| | Thermoelectric conversion layer | Second substrate | | | | Power generation capacity (pipe heater) [μW] | Power generation capacity retention rate |
|---|---|---|---|---|---|---|---|
| | | Thickness of pressure sensitive adhesive layer [μm] | Thickness [mm] | Depth of groove [mm] | Insulating layer | | |
| Example 5-2 | CNT (printing) | 30 | 0.2 | 0.075 | Al$_2$O$_3$ | 25 | 1 |
| Example 6-2 | CNT (printing) | 30 | 0.2 | 0.075 | N/A | 21.3 | 0.85 |
| Example 1-2 | Ni (vapor deposition) | 30 | 0.2 | 0.075 | N/A | 41 | 1 |

2. The thermoelectric conversion element according to claim 1,
wherein a depth of the concave portion is equal to or greater than 20% of a thickness of the second substrate.

3. The thermoelectric conversion element according to claim 1,
wherein the thickness of the second substrate is equal to or greater than 0.05 mm.

4. The thermoelectric conversion element according to claim 1,
wherein the concave portion has a wall all around the peripheral region thereof in the plane direction.

5. The thermoelectric conversion element according to claim 1, further comprising,
an insulating layer on a front side of a surface on which the concave portion of the second substrate is formed.

6. A thermoelectric conversion module comprising:
a plurality of the thermoelectric conversion elements according to claim 1 that is connected to each other in series.

7. The thermoelectric conversion module according to claim 6,
wherein a heat dissipating fin or a heat dissipating sheet is provided on the second substrate side.

8. The thermoelectric conversion module according to claim 7,
wherein the heat dissipating fin or the heat dissipating sheet is bonded to the second substrate by a thermally conductive adhesive sheet or a thermally conductive adhesive.

9. The thermoelectric conversion module according to claim 6,
wherein the thermoelectric conversion elements are one-dimensionally or two-dimensionally arranged,
all of the thermoelectric conversion elements share one sheet of the first substrate and one sheet or the second substrate,
each of the high thermal conduction portions is long in the arrangement direction of the thermoelectric conversion layers, and
each of the concave portions is long in the same direction as a longitudinal direction of the high thermal conduction portions.

10. The thermoelectric conversion module according to claim 9,
wherein the thermoelectric conversion elements are two-dimensionally arranged,
the high thermal conduction portions are arranged such that the longitudinal direction of the high thermal conduction portions coincides with one arrangement direction of the thermoelectric conversion elements and that the high thermal conduction portions are arranged in the other arrangement direction, and
the concave portions are arranged in the same direction as the high thermal conduction portions in a state where a longitudinal direction of the concave portions coincides with the longitudinal direction of the high thermal conduction portions such that the concave portions alternate with the high thermal conduction portions.

11. The thermoelectric conversion module according to claim 10,
wherein the thermoelectric conversion layers are preferably formed at an equal interval in the arrangement direction of the high thermal conduction portions,
the width and the interval of the high thermal conduction portions are the same,
the width and the interval of the concave portions are the same, and
the width of each of the high thermal conduction portions is the same as the width of each of the concave portions.

* * * * *